(12) United States Patent
Korkin et al.

(10) Patent No.: US 11,913,314 B2
(45) Date of Patent: Feb. 27, 2024

(54) METHOD OF PREDICTING AND PREVENTING AN EVENT OF FRACTURE HIT

(71) Applicant: SCHLUMBERGER TECHNOLOGY CORPORATION, Sugar Land, TX (US)

(72) Inventors: Roman Korkin, Novosibirsk (RU); Andrey Fedorov, Novosibirsk (RU); Artem Kabannik, Novosibirsk (RU); Kira Vladimirovna Yudina, Novosibirsk (RU); Dmitry Badazhkov, Novosibirsk (RU); Jared Bruns, Houston, TX (US); Xiaowei Weng, Fulshear, TX (US); Aleksandra Khudorozhkova, Novosibirsk (RU)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 17/757,522

(22) PCT Filed: Dec. 16, 2020

(86) PCT No.: PCT/US2020/065289
§ 371 (c)(1),
(2) Date: Jun. 16, 2022

(87) PCT Pub. No.: WO2021/126963
PCT Pub. Date: Jun. 24, 2021

(65) Prior Publication Data
US 2023/0020671 A1     Jan. 19, 2023

Related U.S. Application Data

(60) Provisional application No. 62/950,310, filed on Dec. 19, 2019.

(51) Int. Cl.
*E21B 43/26* (2006.01)
*G06F 30/20* (2020.01)
*E21B 47/06* (2012.01)

(52) U.S. Cl.
CPC .............. *E21B 43/26* (2013.01); *E21B 47/06* (2013.01); *G06F 30/20* (2020.01); *E21B 2200/20* (2020.05)

(58) Field of Classification Search
CPC ...... E21B 43/26; E21B 47/06; E21B 2200/20; G06F 30/20
See application file for complete search history.

(56) References Cited

U.S. PATENT DOCUMENTS

| 8,412,500 B2 | 4/2013 | Weng et al. |
| 9,900,900 B2 | 2/2018 | Yan et al. |
| (Continued) | | |

OTHER PUBLICATIONS

Gala et al. Modeling of fluid injection in depleted parent wells to minimize damage due to frac-hits. Unconventional Resources Technology Conference. Houston, Texas. Society of Exploration Geophysicists, American Association of Petroleum Geologists, Society of Petroleum Engineers, Jul. 23-25, 2018. (Year: 2018).*

(Continued)

*Primary Examiner* — Crystal J. Lee
(74) *Attorney, Agent, or Firm* — Jeffrey D. Frantz

(57) ABSTRACT

A method is offered to predict and prevent the event of fracture hit (direct fluid communication) between a parent well and a child (active) well. The growth of a child well creates 3D stress field in the vicinity of a parent well. The growth of a child well is simulated using the geomechanic-transport model. A model of interaction between the child well and parent well is provided. The simulations for different job designs create a set of pressure scenario in the parent both for the cases with and without fracture hit (fracture hit catalogue). Comparison (matching) of actual (Continued)

pressure data in the parent and child well with the pre-calculated pressure scenarios indicate the risk of fracture development with a fracture hit, which means a stop in fracturing stimulation.

8 Claims, 9 Drawing Sheets

(56) References Cited

U.S. PATENT DOCUMENTS

| | | | |
|---|---|---|---|
| 10,215,014 B2 | 2/2019 | Dawson et al. | |
| 10,378,333 B2 | 8/2019 | Dawson et al. | |
| 10,436,027 B2 | 10/2019 | Kampfer et al. | |
| 11,035,223 B2 | 6/2021 | Kabannik | |
| 11,220,894 B2 | 1/2022 | Bannikov et al. | |
| 11,341,298 B2 | 5/2022 | Isaev et al. | |
| 2009/0288820 A1* | 11/2009 | Barron | C04B 35/62894 166/250.1 |
| 2016/0003020 A1* | 1/2016 | Sharma | E21B 49/006 166/308.1 |
| 2017/0247995 A1* | 8/2017 | Crews | G01V 1/288 |
| 2018/0258760 A1 | 9/2018 | Kashikar et al. | |
| 2019/0120047 A1 | 4/2019 | Jin et al. | |
| 2019/0128112 A1 | 5/2019 | Spicer et al. | |
| 2019/0153841 A1* | 5/2019 | Randall | E21B 7/061 |
| 2019/0309618 A1* | 10/2019 | Inyang | E21B 47/07 |

OTHER PUBLICATIONS

International Preliminary Report on Patentability issued in PCT Application No. PCT/US2020/065289 dated Jun. 30, 2022, 7 pages.
Gala et al., "Modeling of Fluid Injection in Depleted Parent Wells to Minimize Damage due to Frac-Hits", Unconventional Resources Technology Conference, Houston, Texas, Society of Exploration Geophysicist, American Association of Petroleum Geologists, Society of Petroleum Engineers, Jul. 23-25, 2018, pp. 1-14.
Shokri et al., "Deployment of Pressure Hit Catalogue to Optimize Multi-Stage Hydraulic Stimulation Treatments and Future Re-Fracturing Designs of Horizontal Wells in Horn River Shale Basin", Society of Petroleum Engineers, SPE 196221, Univ. of Alberta, 2019, 21 pages.
Nikitin et al., "Properties of low-frequency trapped mode in viscous-fluid waveguides", Geophysical Prospecting, vol. 64, 2016, pp. 1335-1349.
Written Opinion of International Patent Application No. PCT/US2020/065289 dated Apr. 2, 2021, 5 pages.
Search Report of International Patent Application No. PCT/US2020/065289 dated Apr. 2, 2021, 5 pages.

* cited by examiner

| Child well frac params | Parent well frac params | dP, psi | comments |
|---|---|---|---|
| ||||||||| | ||||||||| | 5 | Multiple weak and local stresses |
| ◯ | ◯ | 6.5 | Stress created is strong but local |
| ◯ | │ | 5.6 | Positive and negative dP cancellation |
| ◯ | ||||||| | 1 | Stress created is strong but local |
| ◯ | ◯ | 5.6 | Stress created is strong but local |
| │ | ||||||||| | 39 | Stress is not local, only positive dP |
| │ | ||||||||| | 34 | Stress is not local, only positive dP |

FIG. 7

METHOD OF PREDICTING AND PREVENTING AN EVENT OF FRACTURE HIT

CROSS-REFERENCE TO RELATED APPLICATIONS

This application claims priority to U.S. Patent Application No. 62/950,310 filed on Dec. 19, 2019, which is herein incorporated by reference.

INTRODUCTION

The fracture geometry determination is a topic directly related to the well productivity. Especially for infill drilled wells, the new wells during fractures initiation may cause detrimental effects on existing wells productivity. There are many efforts performed by oilfield service companies to characterize the fractures geometries using various methods: pressure monitoring during fracturing, microseismic, readings from distributed acoustic and temperature sensors, etc.

BACKGROUND

U.S. Pat. No. 10,215,014 discloses mapping of fracture geometries in a multi-well stimulation process. Method uses one treated and one or more monitoring wells. The simulated fracture geometry may provide a minimum error between the simulated pressure signal and assessed pressure signal. This process repeats for each fracture (considering the geometry parameters of previous fractures) with minimal total error. Examples of subsurface gauges: downhole gauges, fiber gauges, memory gauges. Gauges can be placed in a plug used between stages. The pressure-induced poromechanical signals may be identified using assessed pressure signals. This signals may be identified in the pressure versus time curve and it can be used to assess one or more parameters of fracture system. In current disclosure the downhole gauges are not foreseen to make service faster and more cost effective.

U.S. Pat. No. 10,378,333 discloses systems and methods for using pressure signals to assess effectiveness of a diverter in a simulation wellbore. Method uses one treated and one or more monitoring wells. The diverter efficiency is determined taking the difference of pressure curves slope before and after diverter pumping. Decreasing pressure in the monitor well may give an indication about the diverter effectiveness. Though the main objective is not a fracture geometry determination, the method is very similar.

The current disclosure assumes different approach for data processing as based on high frequency pressure monitoring, allowing getting more information.

In patent Applications US2018258760 and US2019128112 the fracture geometry is also determined with the pressure sensors at a monitoring well. The monitoring well has a seal, which divides wellbore into two parts with pressure gauges in each part. Because of several pressure gauges are in different parts of the wellbore—this gives the geometry of the fracture. The number of gauges also can be increased (or the number of observation wells). Determination of fracture parameters is based on the solution of optimization problem. Compare to most of solutions described, the current disclosure doesn't assume sealing a parental well. Instead, there is one pressure sensor for the whole parent well. As a result, the operation time is decreased, decreasing the cost of service.

U.S. Pat. Nos. 9,900,900 and 10,436,027 suggest using one or more monitoring wells to monitor pressure change in the monitoring well while pumping at the treated well. It is foreseen pre calculating a set of pressure responses at a monitoring well for each fracture geometry and then select proper geometries matching the measured pressure response. The precalculated results are based on a coupled solution of solid mechanics equations and pressure diffusion.

The current disclosure foresees high frequency pressure monitoring. It provides an indication whether there is a direct fluid migration between two fractures independent of the pressure rise value. It also allows evaluating the character of channels causing pressure migration (multiple fractures vs one fracture/width of fracture/fractures, etc.) by analyzing the spectral density of pressure from parent and child wells. The other difference is that the pressure diffusion is not used in the models precalculated, instead, the geomechanics with effective coefficients is foreseen coupled with the hydrodynamics, describing direct fluid migration through the "channels", caused either direct fracture connection or by means of multiple natural fractures (the phenomena different from the diffusion). The parameters of such "channels" are taken from the spectral density consideration.

Paper SPE-196221-MS "Deployment of pressure hit catalogues to optimize multi-stage hydraulic stimulation treatment" (Univ. of Alberta, 2019) describes solution of the same problem—stimulation through fracturing on a pad with several multistage wellbores (passive and active wellbores).

A passive well (offset parent well) has a pressure gauge (high resolution pressure gauges) that can monitor a change in pressure due to fracturing stimulation in the active (child) wellbore with a developing fracture. One frac operation occurs during the stimulation.

A high-pressure peak signal immediately after frac operation can be considered as fracture hit from the child well. Alternatively, the passive pressure response can be triggered by fracture stress and pressure shadowing effect. The full mechanical simulation of a set of child-parent wells is performed with fully-coupled 3D modeling providing the curves for pressure hits collected in a catalogue with four main indicators, including the high travel speed for pressure response (see FIG. 7 of the SPE paper). Different discrete fracture patterns can be modeled by the 3D hydromechanical code characterized by Fracture Complexity Index (FCI) and matched to the fracture hit scenario.

However, the simulation procedure to distinguish stress shadow (stress field) from the direct hit phenomena (both induce higher pressure in the passive well) was not defined in this study. The distinguish should be based on clear criteria for further decision-making stop pumping, change pumping strategy, etc.

Glossary

Fracture fit (pressure hit for active-monitor pair of wells)—a direct fluid communication between two fractures originating from two neighboring wells.

Child well (active well)—a well with on-going fracture growth (frac pump is on).

Parent well (passive well)—a well with steady and propped fractures (an offset well relative to the active well). Info about this kind of well is pretty known (positions of propped fractures and volume for every fracture). As the fracture grows in the child well, the pressure in the parent well increases by two mechanisms—effective stress field and direct fluid communication (fracture hit).

Child/parent well interaction—transfer of fluid and pressure from one well to another High frequency pressure gauge—a pressure sensor with a high rate of pressure data reading, for construction of spectral density from the pressure time curves. It allows to monitor well pressure with frequency >5 Hz.

Stress shadow (effective stress field)—the effect of local change in pore pressure in formation due to change in the stress distribution (nonuniform stress distribution).

Fracture geometry—one (or several) geometry parameters of a fracture (length, height, width, number of fractures).

Average fracture geometry—the geometry of "average fracture" in the child (active) well that fits the pressure scenario.

Spectral density—a plotting of absolute values of pressure Fourier coefficients in various time windows and frequency domains (axis: x—time, y—frequency). Pressure means the pressure detected by a high frequency pressure gauge. See FIG. 5, FIG. 6.

Fracture hit catalogue—collection of simulated and actual pressure response vs. time curves covering the event of direct fluid communication (a fracture hit).

Pressure scenario for parent well—the pressure vs. time curve for the parent well while child fractures growth. The moment of fracture hit (or its absence) is a description marker for this scenario when stored into computer memory.

Kinetix fracture simulator—a Schlumberger Company code for fracturing simulation with matched geomechanical and fluid transport submodels (full proppant transport model). Here it allows to predict the detailed fracture growth process in the child well and offers the input data to the submodel of effective stress field (or stress shadow).

WellWatcher Stim® simulator—a Schlumberger code that allows to define the actual position (depth) of an open fracture for the case of multi-interval stimulation. The method is based on computer processing of reflected pressure signals. It has been described in the Patent Application WO 2018004369. Here it is for calculating the true position of a growing fracture in the child well.

A method is offered to evaluate the average geometric parameters of fractures emanating from a child well in the vicinity of a parent well with the aim of predicting and avoiding the event of fracture hit (direct fluid communication between stimulated fractures).

SUMMARY

The method is applied on a well production pad with at least one parent well (with competed fractures) and at least one child well with a growing fracture(s). Both kinds of wells are equipped with high-rate pressure sensors suitable for digital monitoring of pressure data at the wellheads. The next stage in the method is designing a set of for stimulating (fracturing) job designs of a child well that can predict both fracture growth scenarios with and without fracture hit. The simulation is based on the input of formation data, parent well data and child well job designs coupled with a model the interaction between the parent well and the child well. This modeling gives the inputs for the stress model (3D geomechanical model) describing the stress distribution near the wells. Then the operator performs fracturing operation in the child (active) well and the high-rate pressure sensors in both wells monitor the pressure data. The actual pressure data are compared with pre-calculated pressure data from the "fracture hit catalogue" stored in the computer memory. If the matching is positive, the fracturing operation is stopped (to prevent the event of fracture hit). If the matching (within assigned accuracy limit) is negative, the operator continues performing the fracture operation until the finish of the fracture job design. This procedure allows to stop the fracturing job at the proper time and avoid the event of fracture hit between two wells (a direct fluid communication between two wells).

BRIEF DESCRIPTION OF DRAWINGS

FIG. 7 is a chart of possible orientations/configuration for sets of parent (passive) and child (active) wells and a database for net pressure response.

DETAILED DESCRIPTION

Figure 1:
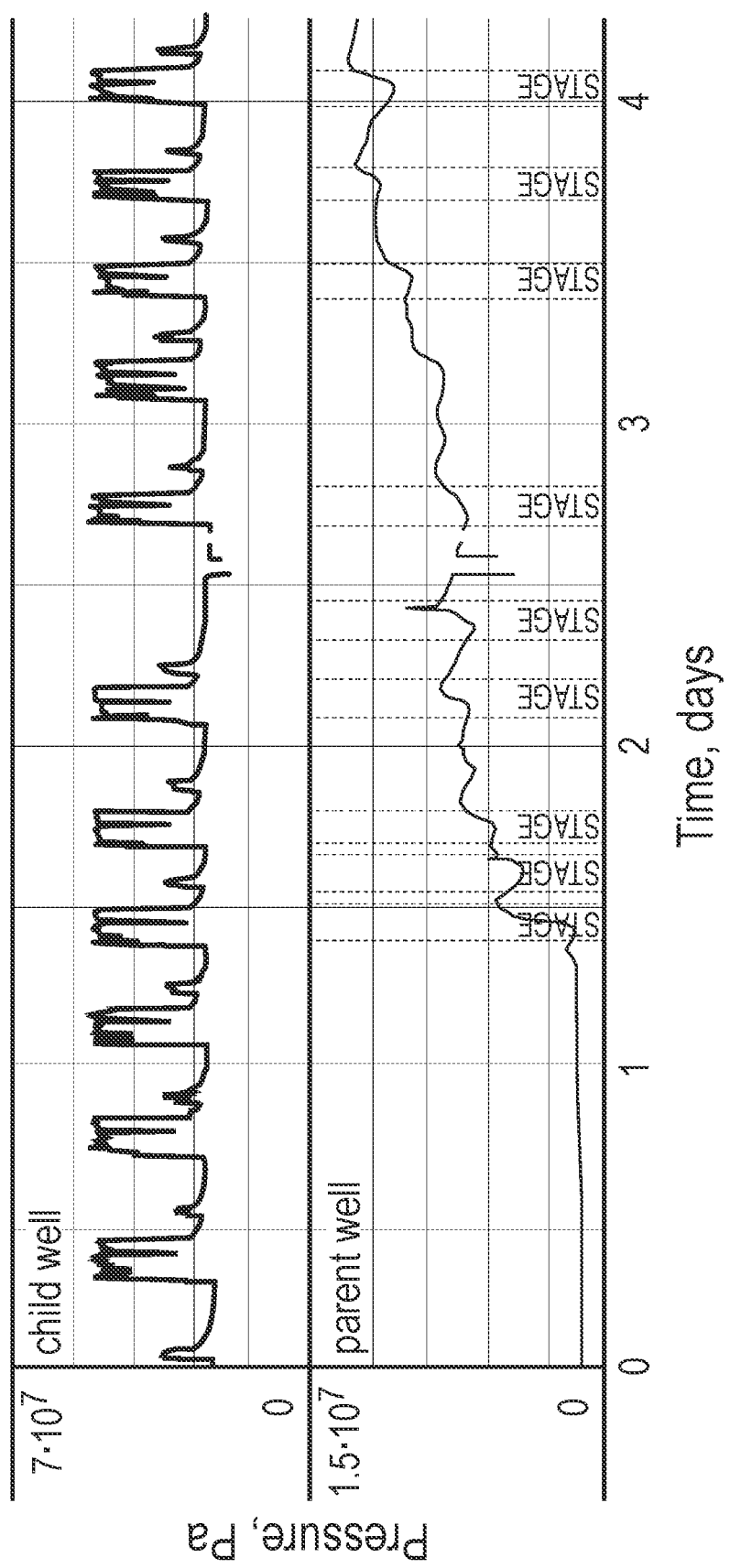
FIG. 1 shows a typical pressure behavior during pumping at a child well (top) and a parent well (bottom).

Creating a new fracture in subterranean formation causes fluid and rock compression in surrounding media. In the case when a parent well with existing fractures exists nearby the growing fracture, pressure increase can be observed on the parent well, if a pressure gauge is installed. This may be caused by two effects: stress shadow (poroelastic formation deformation caused by a growing fracture and as a result parent well pressure increase) and the direct fluid migration (sometimes referred as fracture hit). In FIG. 1 the pressure behavior at a child well and a parent well are shown.

Figure 2:
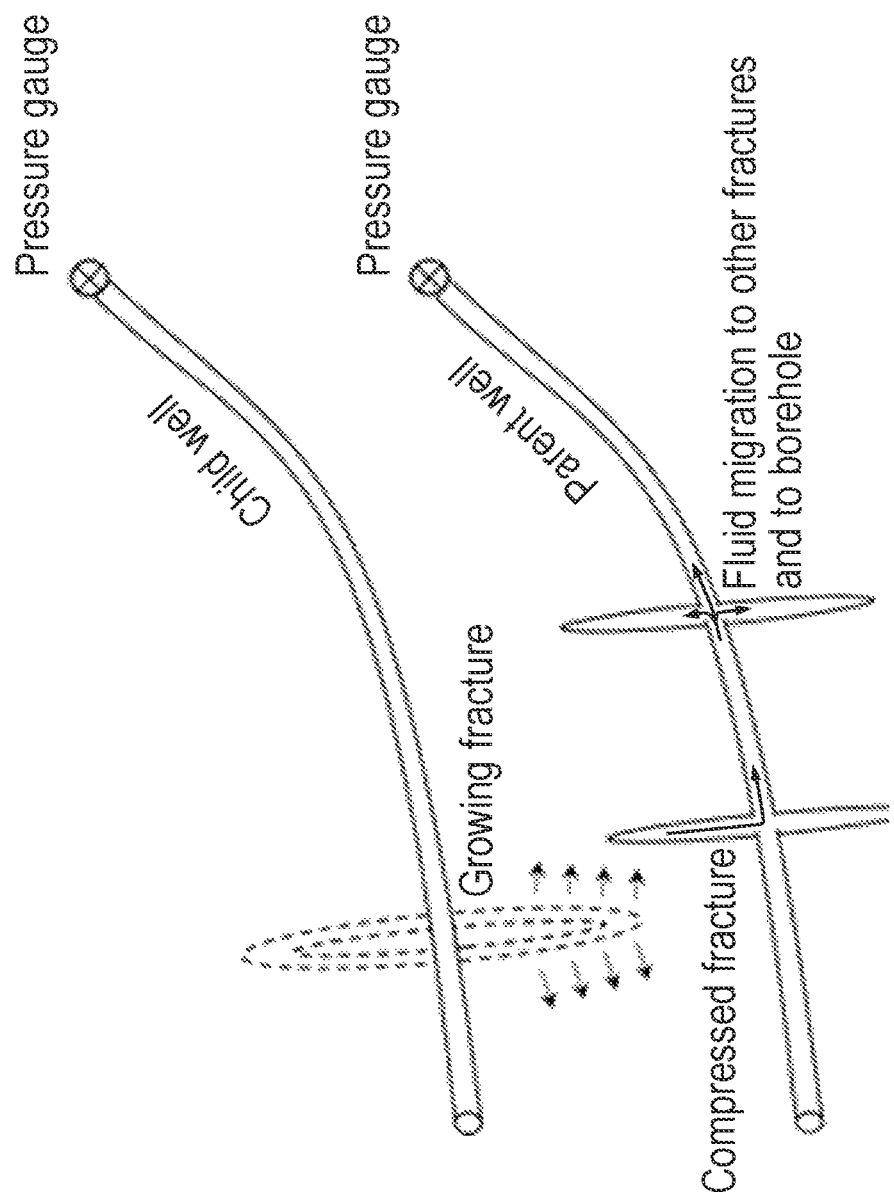
FIG. 2 depicts the migration of fluid and pressure from a child well to a parent well.

In FIG. 2 the mechanism of pressure rise at a parent well surface pressure gauge is shown. The stress shadow causes formation compression around a growing fracture. The compressed formation causes compression of existing fractures connected to the parent well. The fluid from the compressed fracture migrates to the borehole and to other fractures existing at the parent well.

Regardless of pressure redistribution in the parent well, the effective volume decrease causes the pressure to increase in the parent well.

Note, the well is not equipped with seals and there is one pressure sensor for the whole parent well. From one side, this causes a smaller pressure growth as compared to a sealed case (because fluid may migrate to already existing fractures at the parent well). From the other side, it decreases operational time, costs and equipment (avoiding pressure sealing).

The direct fluid migration from a child to a parent well may be caused by direct intersection of a new, growing fracture (at a child well) with the existing fracture (at a parent well) or by means of natural fractures system.

The described method comprises three main steps: pre job run, on the job run and post job (if needed). The pre-job run assumes formation data, wellbore data, child well fracturing design parameters and parent well data. The schematic workflow is presented in FIG. 3.

Minimal formation data includes formation temperature, lithology, Young's modulus, Poisson's ratio, reservoir pressure, permeability, porosity, minimum in-situ stress value and direction. All these parameters should be defined for a zone of interest and nearest adjacent zones to define where fracture can propagate and what barriers will constrict fracture growth. Formation data in most cases brings the most uncertainty to the whole modeling process, as it is costly to obtain precise data. DataFRAC analysis can be used as a tool to define some formation parameters.

Minimal wellbore data includes well deviation, azimuth, wellbore completion for child and offset wells. Well deviation and azimuth are precise and reliable data. Wellbore completion data can have some uncertainty. E.g. during plug&perf completion plug can fail, perforation gun can fail, not all perforations can be open and therefore not all of them taking fluid. In sliding sleeves completion some sleeves can be broken and taking fluid to a different interval.

Child well fracturing design includes the pumping strategy, materials information (data on proppant, fluid, fibers, diverting materials like Broad Band Shield, BROADBAND SEQUENCE®), and the chemical additives used in the frac operation.

Pumping fluid parameters are not precisely known before the job start as they depend on surface temperature, water composition, actual pumping concentrations, quality and physical condition of materials present on location.

These data are used as an input for simulation using a hydraulic fracture model, such as joint geomechanics and fluid hydrodynamic modeling as described in U.S. Ser. No. 16/302,424 or UFM Model (U.S. Pat. No. 8,412,500), and a parent/child interaction model. This simulation proved to show robust results at correct input parameters. However, the input parameters are determined with uncertainties. In case of multiple perforation clusters per stage the dimensions of the created fractures are strongly influenced by the rate split among the clusters of which the model prediction may have uncertainty. The output of a hydraulic fracture model at a pre-job stage is a set of possible scenarios of fracture geometry over time depending on the fluid distribution between clusters for both child and parent well fractures. The parent/child interaction model describes the stress shadow at all points of a formation for all pre-defined scenarios simulated by the fracture model. Moreover, scenarios with direct fluid migration effect on the parent well frac may be pre-computed and used for determining the probability of a direct fluid migration for each precalculated scenario.

Figure 3:
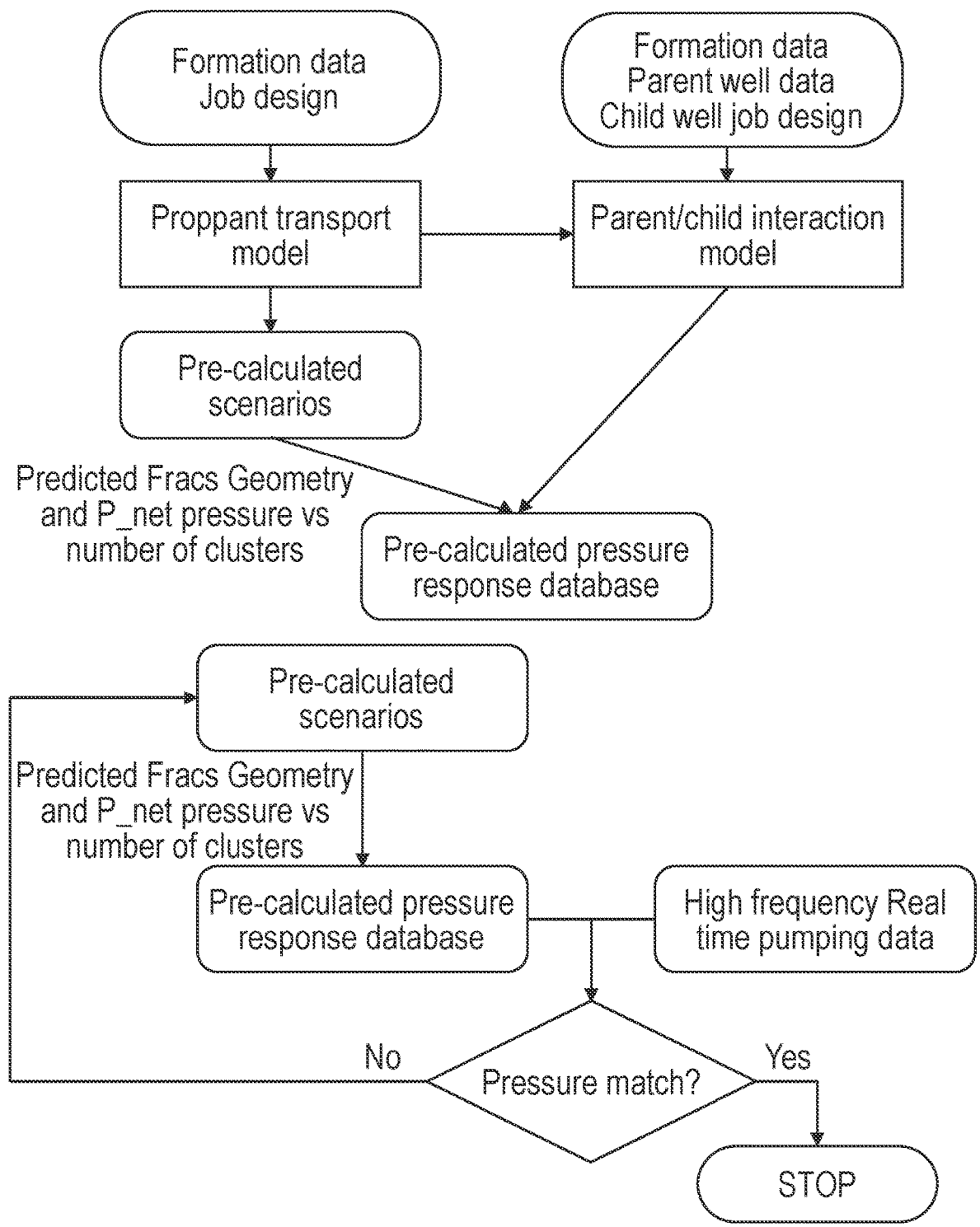
FIG. 3 shows a workflow preventing of fracture hit between two wells through matching the precalculated pressure scenarios with pressure data. The workflow includes determination of geometry parameters for two wells.

On the job run is described in FIG. 3. Here the precalculated scenarios (fractures geometries determined for each scenario and resulted stress shadows and direct fluid migration probabilities) are used as input data for on-the job modeling. The workflow assumes matching the pressure signal at both child and parent wells with the pressure behavior predicted by these scenarios, utilizing the monitoring of spectral density at parent and child wells. In addition, for a discrimination of direct fluid migration from a stress shadow the spectral density is estimated at parent and child wells. Their comparison together with the total pressure increase provides valuable information whether direct fluid migration exist, or the pressure rise is caused by the stress shadow. Moreover, if the direct fluid migration exists, the spectral density allows predicting the effective parameters of the fractures network: either natural fractures or induced fractures, such as fracture width and their number/density (if natural fractures contribute). It allows making first step selection from the pre-calculated scenarios. The first step of selection of pre-calculated scenarios or input parameters adjustment for on-the-job matching are also facilitated by matching the start time of the observed pressure rise at the parent well which has a strong correlation with the fracture geometry since fracture intersection/overlap is required in order to initiate the stress shadow or fluid migration.

Further matching of the rest of the scenarios with the pressure vs time is performed. If pressures records do not match at some point of time the precalculated scenarios, more scenarios are rejected, reducing the remained scenarios with their fracture geometries. Ideally, when the fluid is pumped and the fracture/fractures are developed, the set of scenarios remained should be very limited and provide very similar fracture parameters. If the number of clusters stimulated is unknown after full pumping period pressure matching, few scenarios remain with their fracture/fractures' geometry uncertainties. In worst case, the fracture/fractures is/are determined with some uncertainty. For example, width/height/length are known with tolerances for each fracture from current cluster.

The workflow can also include performing a calibration stage. During this stage stress shadow followed by a fracture hit is a desirable event. Parameters calibration for a stress shadow and a fracture hit events can be established and used for further stages to predict unwanted behavior in advance. Unwanted behavior (e.g. a fracture hit) can be avoided by changing pumping parameters: changing pumping rate, addition of a chemical diverter, changing fluid viscosity, stopping the stage and so on. The difference of this method is using high frequency pressure monitoring and on time discrimination of a direct fracture hit from a stress shadow, making conclusions about natural fractures contribution, etc. Without such evaluation, the fractures geometry prediction may be done inadequately.

The same workflow of precalculated pressure behaviors matching with the measured during stimulation is used for next stages, reducing the remained uncertainties. At the end of pumping of few stages, the inverse model as a fit scenario is determined, making known all fractures developed with reasonably small uncertainties. Moreover, using already matched data the job design may be changed on the fly (e.g., pressure rise caused by direct fluid migration, estimate of the required concentration of the diverter usage (for example, a commercial product for fluid diversion Broad Band Shield)

from the parent well pressure response, more appropriate pumping rate, etc). Lastly, the current stage treatment may be stopped earlier than per design if the fracture hit occurrence has been confirmed from the measured data or its probability is high.

The post job analysis may be done for refining the parameters determined (such as frac azimuth, especially if more than one monitoring wells were used), drainage area characterization, etc.

The provided data are further used for the database of direct fluid migration with the description of all relevant parameters. This database is upgraded with every new job, making direct fluid migration prediction more and more accurate.

The parent/child interaction model contains at least three sub-models: stress shadow, direct fluid migration, and parent well response.

Figure 4:
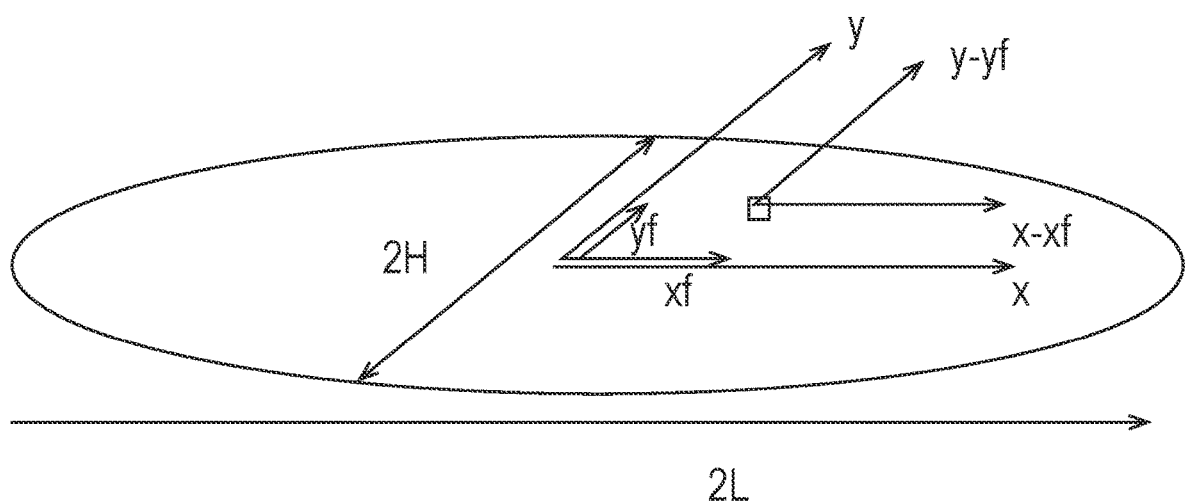
FIG. 4 depicts an elliptical-shaped fracture divided split into multiple sub fractures. This allows applying of a displacement discontinuity method.

The stress shadow model may be described by one of geomechanical methods, for example (but not limited to) the displacement discontinuity method for formation stresses calculation based on known fracture parameters (pre-calculated with fracture model). The fracture may be divided into multiple sub-fractures with given widths/length/heights and the total formation stress is found as a sum of the stresses induced by all sub-fractures. For each sub-fracture, the zz-component of the induced stress (normal to the fracture) in the simplest homogenous formation is described as:

$$\sigma_{zz} = \frac{ED}{8\pi(1-v^2)}(I_{zz} - zI_{zzz}),$$

where $$I = \int\int \frac{d\xi d\eta}{\sqrt{(x-\xi)^2 + (y-\eta)^2 + z^2}}$$

is taken within area of constant width. The typical split of a fracture into sub-fractures is shown for an elliptical fracture in FIG. 4. Each small fracture ("subfracture") may be approximated as a constant width and the total stress fiels is a linear combination of all subfractures contribution.

The parent well response model can be easily described as:

$$\Delta P_{wh} = K_w \frac{c_{fr} \int w(\vec{r})\sigma_{zz}(\vec{r})dS(\vec{r})}{V_{tot}},$$

where $C_{fr}$—proppant pack compressibility, $V_{tot}=V_{bh}+\Sigma_{all\,fractures} V_{fr}$ is the total volume available for the fluid redistribution (wellbore volume and sum of all fractures volumes existing in a parent well). Note, the pressure response is smaller for parent wells with a large number of fractures.

The direct fluid migration model regardless its nature (i.e. natural fracs connecting parent and child well fracs or direct parent/child wells fracs connection) assumes the existence of a channel with the fluid migration from a child well frac to a parent well frac. In this case, the pressure change in the parent well is influenced by two processes: fluid migration from the child well and leak-off to the formation, so that the pressure can be described as:

$$\frac{dP_1}{dt} = C_{fm}S_c\frac{P_2-P_1}{V_1} - C_1S_1\frac{P_1-P_0}{V_1}, t < t_{pump},$$

where $P_1$ is the parent well wellhead pressure, $P_2$ is the child well pressure, $P_0$—the reservoir pressure, $C_{fm}$ is a fluid migration coefficient (which includes the channel width/length/height, pumped fluid bulk modulus, and fluid viscosity), $C_1$ is a leak off coefficient (which includes fluid properties, formation properties, and may be time dependent), $V_1$ is the parent well volume (including fractures volume filled with fluid), $S_1$ is the fracture surface area, $S_c$ is the connection area, and $t_{pump}$ is the total pumping time.

After pumping stops, the equilibrium is achieved in both parent and child wells and is managed by the following equations (which is result of mass conservation law for incompressible fluid in a porous medium with communicating wells):

$$\frac{dP_1}{dt} = C_{fm}S_c\frac{P_2-P_1}{V_1} - C_1S_1\frac{P_1-P_0}{V_1}$$

$$\frac{dP_2}{dt} = -C_{fm}S_c\frac{P_2-P_1}{V_2} - C_2S_2\frac{P_2-P_0}{V_2}$$

The parameters $V_1$, $V_2$ are generally known, the $C_1$, $C_2$ are not known, but assuming the reservoir properties are the same for parent and child wells, their ratio may be found (as effective ratio of fractures surface areas). The pressure change with time for parent and child well is very sensitive to these parameters and to $C_{fm}$ and thus, they should be accurately determined from the pressure behavior. Note also, that the exponential behavior of pressure on time (which is shown from the equations above) can distinguish whether the pressure evolution is caused by the stress shadow or by the direct fluid migration (at least for significant pressure rise). It should also be noted that at some parameter's ratio (when the leak off is small or large compare to parameter $C_{fm}$) the parent well pressure may continue grow after pumping stop or it may start decreasing just after pumping stop. For the case of simplicity, one may assume that the leak off coefficients are similar for both parent and child wells and are proportional to the total fractures areas and that the fractures have comparable geometries with volumes exceeding borehole volume.

Then, $$C_1\frac{S_1}{V_1} \sim C_2\frac{S_1 n}{V_1 n} = C_2\frac{S_1}{V_1} = \beta$$

At the same time $$\frac{C_{fm}S_c}{V_1} = \alpha_1 \ll \frac{C_{fm}S_c}{V_2} = \alpha_2,$$

because in child well all but one stages are isolated. The simplified system of equations:

$$\frac{dP_1}{dt} = \alpha_1[P_2 - P_1] - \beta[P_1 - P_0]$$

-continued $$\frac{dP_2}{dt} = -\alpha_2[P_2 - P_1] - \beta[P_2 - P_0]$$

may easily be solved and it shows:

$$P_1(t) = \frac{[P_1(0) - P_0]\alpha_2 + [P_2(0) - P_0]\alpha_1}{\alpha_1 + \alpha_2} \times \exp(-\beta t) -$$

$$\alpha_1 \frac{P_2(0) - P_1(0)}{\alpha_1 + \alpha_2} \times \exp(-[\beta + \alpha_1 + \alpha_2]t) + P_0$$

Here 0 moment of time is a time when pumping stop, t is time since pumping stopped. For $\alpha_1 = \alpha$ and $\alpha_1 - n\alpha$, where n is a number of fractures existed in parent well the pressure increases or decrease in the first moments of time after pumping depends n the sign of pressure derivative:

$$\dot{P}_1(0) = -\beta \frac{[P_1(0) - P_0]n + [P_2(0) - P_0]}{n+1} + [\beta + \alpha + n\alpha] \frac{P_2(0) - P_1(0)}{n+1}$$

This value is positive if:

$$\alpha[P_2(0) - P_1(0)] > \beta[P_1(0) - P_0]$$

I.e. the parent pressure rise due to inflow from a child well should exceed pressure loss due to leak-off to the formation. This works either for significance of child well pressure compare to parent well pressure or due to significant connection area between wells for depleted reservoirs.

Figure 5:
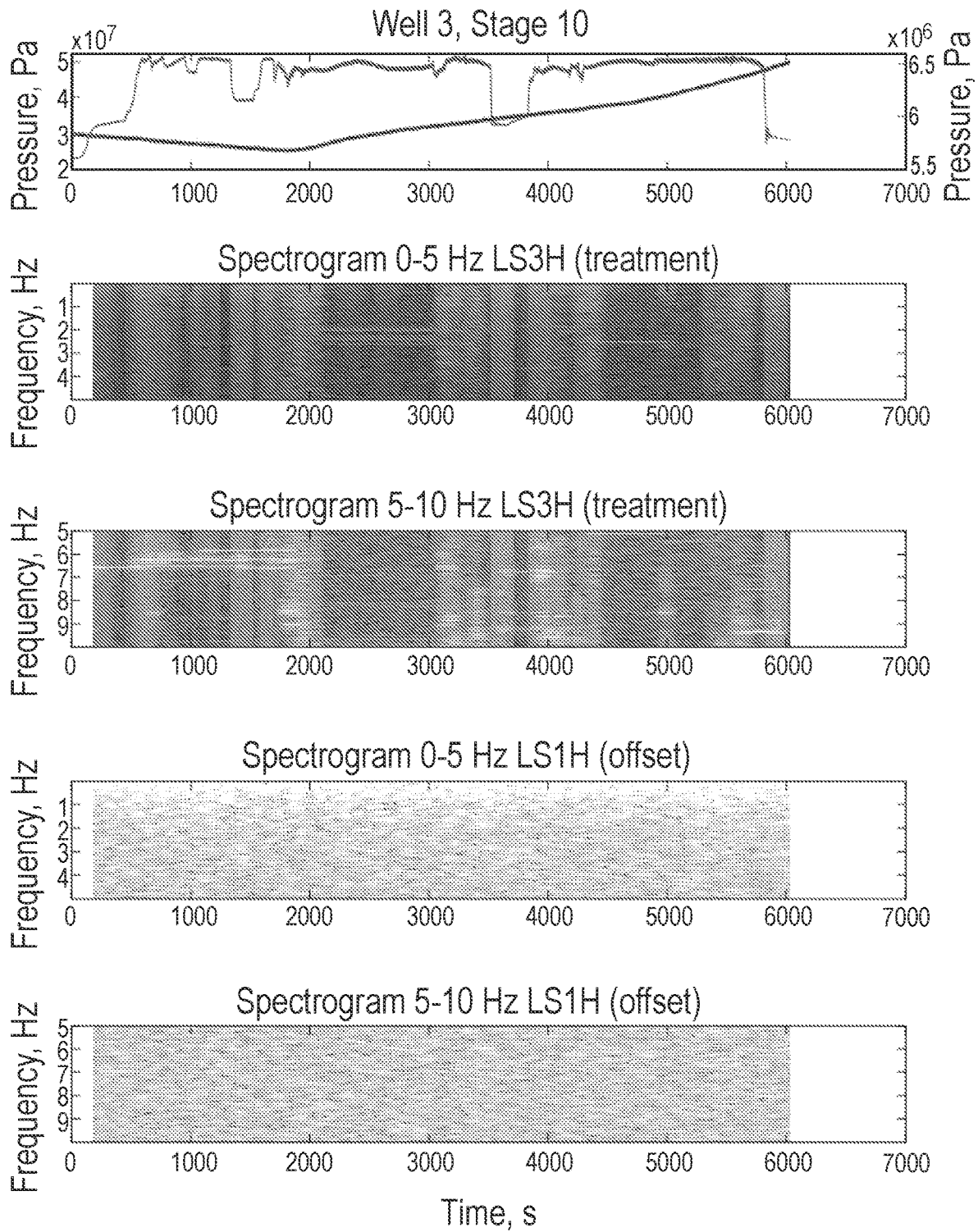
FIG. 5 shows typical spectrograms for pressure signal induced by the stress field (no fracture hit between two wells—see two top and two bottom charts).
Figure 6:
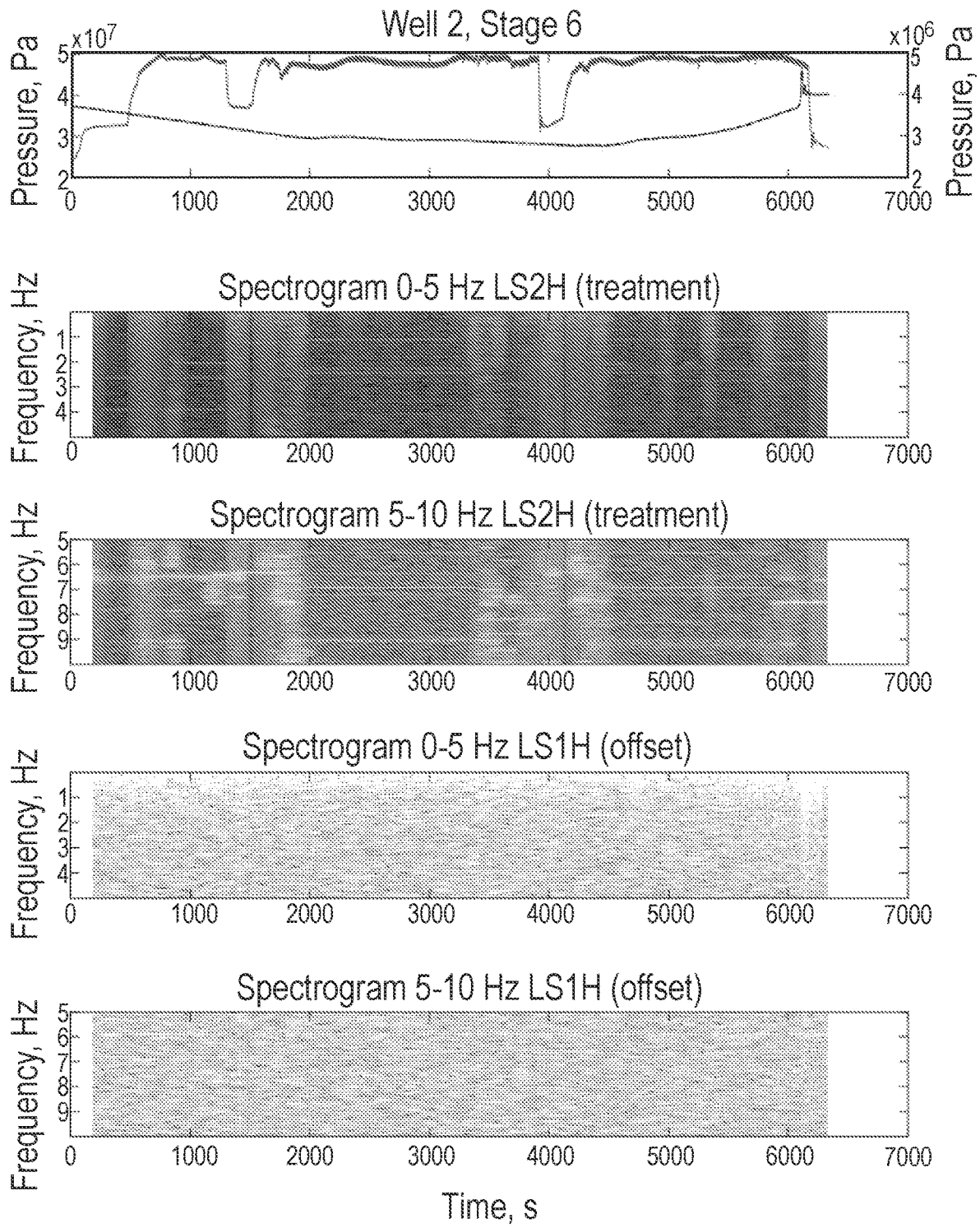
FIG. 6 shows a typical direct fluid migration at the background of stress shadow induced by fracturing process from the child well. Frequency analysis at 0-5 Hz and 5-10 Hz. Two bottom charts—the parent well. Two upper charts—the child well.

The use of spectral density allows discriminating stress shadows from a direct fluid migration. Indeed, the stress shadow causes slow pressure growth and depends mostly on the child well fracture geometry. The direct fluid migration, if it is strong enough, should cause comparatively high frequency oscillation generation at first moment of fluid migration (or after migration has started and child well pressure changed). This should create higher spectral density at high frequencies (at least few Hz). The typical frequency spectrum response for a stress shadow and direct fluid migration effects are shown in FIG. 5 and FIG. 6. It can be found typical frequency of waves propagated from a child to a parent well in case of direct fluid migration.

In FIG. 5 it is observed pressure rise at 6000 sec of pumping time. This rise is also seen in a spectrogram for 0-5 Hz frequencies at the same time. Contrary to that, the pressure rise observed in FIG. 5 is not accompanied by the corresponding spectral density increase (there are no simultaneous spots at the child and parent well). The speed of pressure rise is also much slower in FIG. 5 and the total amplitude is less than 30 psi (vs. 500 psi as in FIG. 6).

Waves of different frequencies have different attenuation depending on the fracture width and distance; thus, low spectral density indicates thin fractures, high spectral density is related to the medium/thick fractures. Coupling with the amplitude of pressure rise it allows to qualitatively discriminate both effective fractures' width and their number.

The two lower charts depict the data for the parent well (little or no change in spectral density). The two upper charts depict the data for the child well (bigger fluctuations in pressure and higher spectral density at few Hz). The frequency responses at both parent and child wells are seen simultaneously at approximately 6200 sec in FIG. 6 (inside the black rectangle). This indicates the direct fluid migration from one fracture to another. In this case it may also be seen from pressure rise in a short period of time, which is too high to be caused by stress shadow only (considering the distance between wells and their geometries). However, in other cases (at small distance between wellbores) the pressure analysis itself is not able discriminating direct fluid migration from a stress shadow and spectral density plots may be very useful.

In additional to this, pressure and or vibration source generator may be installed on wellhead of offset wells. This pressure/vibration source is generating modulated signal which is reflected from most opened perforation in the well. Those perforation is taking extra fluid from growing fracture. The analysis of reflected pressure signal and applying algorithm describing in Patent Application WO 2018004369. The analysis gives the perforation, which takes most of fluid. The geometrical comparison of reflected perforation and current stage on treating well gives the azimuth of growing fracture.

The extra assurance of possible events can be applied by analysis of pressure signal on treated wells. As soon the pressure gauge registered modulated pressure signal which is generated on offset well it gives extra evidence of communication between two wells. In additional of this every offset well can generate unique pressure/vibration pattern can be easily recognized on treated wells.

EXAMPLES

In one of considered jobs the offset well pressure was matched with precalculated scenarios and was found that few stages had pressure rise due to stress shadow. It was concluded from both: relatively low-pressure rise ~40 psi and no well-resolved high frequency waves propagation indicated in spectral density. Then, the scenarios calculated from stress shadow model were compared with the observed pressure rise. It was shown that the pressure grow of the order of 40 psi for given conditions (wellbore geometry, presence of ~20 stimulated intervals in the offset well, large distance between wells) cannot be caused by the successful stimulation of all perf clusters in the interval, one of them could accept fluid at given stage of a child well. The very simplified description of scenarios selection shown FIG. 7. Here the max pressure rise of about 40 psi could be caused by two last scenarios, in both cases one comparatively long fracture was formed at the child well. It is interesting to note, that some of information may be obtained about a parent well fracture as well: it is shown that the fracture cannot be too long. At the same time, it is not clear whether one comparatively thick fracture was formed or many thin fractures. Even this can be clarified if historical information is available from the client.

So, the fracture width and height relation were found from a simulation results and matching instantaneous shut in pressure, the length found from the stress shadow model matching, while the total volume of a fracture found from a total pumped volume with the leak off correction.

Modelling of Stress Surfaces

Figure 8:
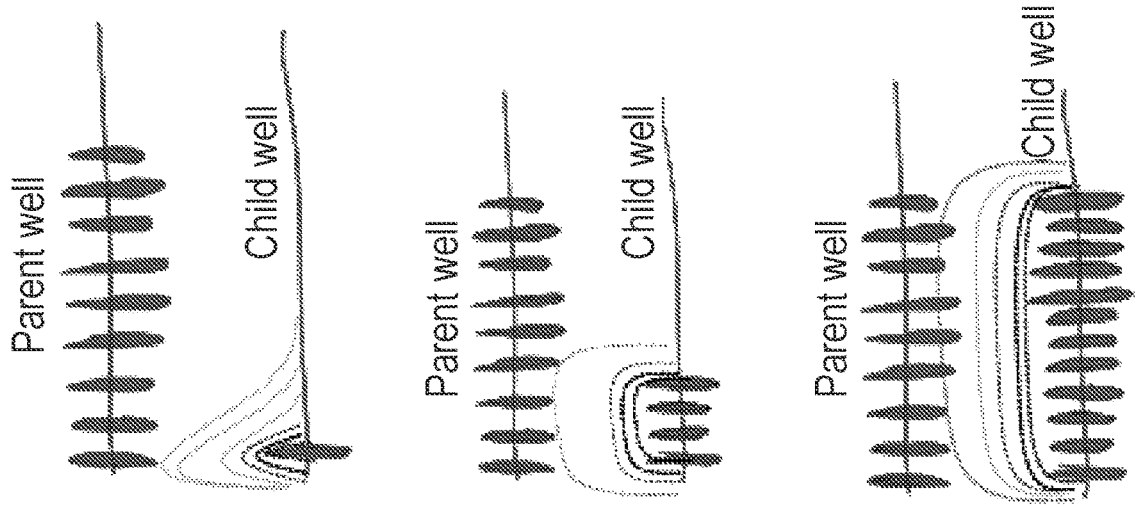
FIG. 8 illustrates the surfaces isolines of stress during multistage fracturing (originated from the child well).

While a well is being stimulated a rock stress around it appears. An approach includes modelling of surface of stress which represents surfaces of equal stress. Particularly surface with some critical level of stress. FIG. 8 shows surface of stress during multistage fracturing. Taking into account different aspects the critical stress level can be defined for particular child-parent wells (or the system including several parent wells and several child wells). Below safe and critical surface are used. The safe surface is defined as a surfaces with the stress level below stress level, which may cause frac hit and critical surface—the surface with the stress level equal to the stress which can cause frac hit. If critical surface touches parent well fractures—fracture hit happens. The parent well should not occur inside the critical stress surface of an active well. During pre-job stage the model position of critical surface and position of safe surface versus fracturing parameters (volume pumped, pumping rate, amount of sand, time between stages, leak off etc.) is going to be evaluated. Base on that fracturing design for all stages can be selected prior to fracturing campaign to keep in save zone: no fracture hits and fractures goes as close as it can be safe.

Figure 9:
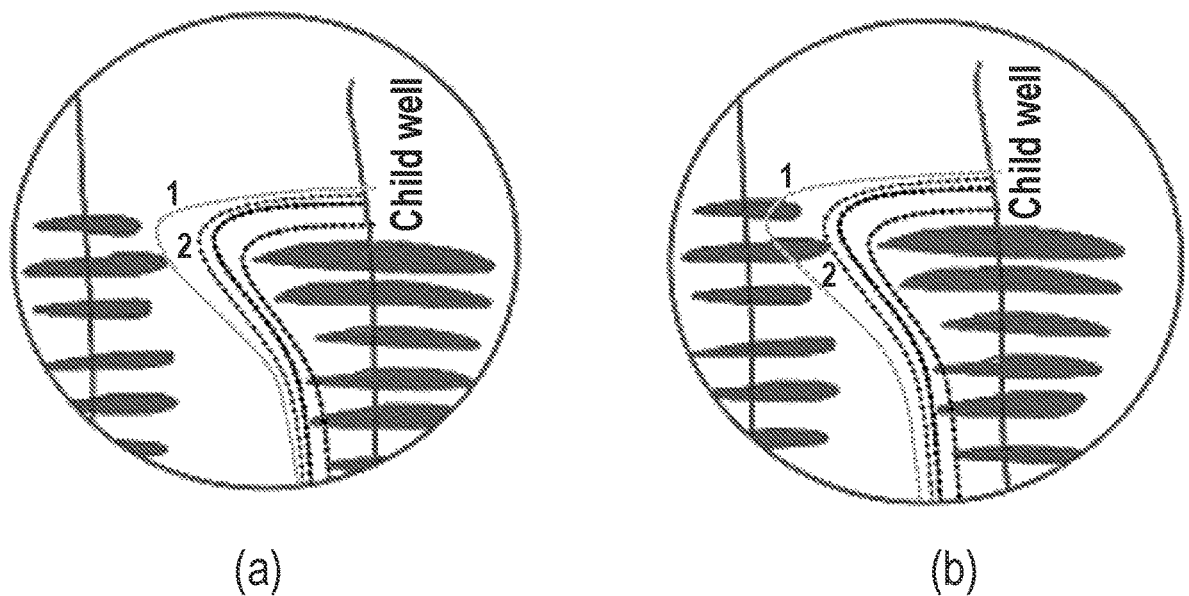
FIG. 9 illustrates a distinction between event of "no fracture hit" and "fracture hit". (a)—when the safe surface touches the parent well zone—no fracture hit. (b)—when the critical surface touches parent well fracture—fracture hit occurs.

FIG. 9 shows distinction of safe fracturing and fracture hit. On the left, safe surface touches parent well—this mean that fractures located close, but we are in safe zone. On the right, wells are located too close, so critical surface touches of parent well—fracture hit happens.

Figure 10:
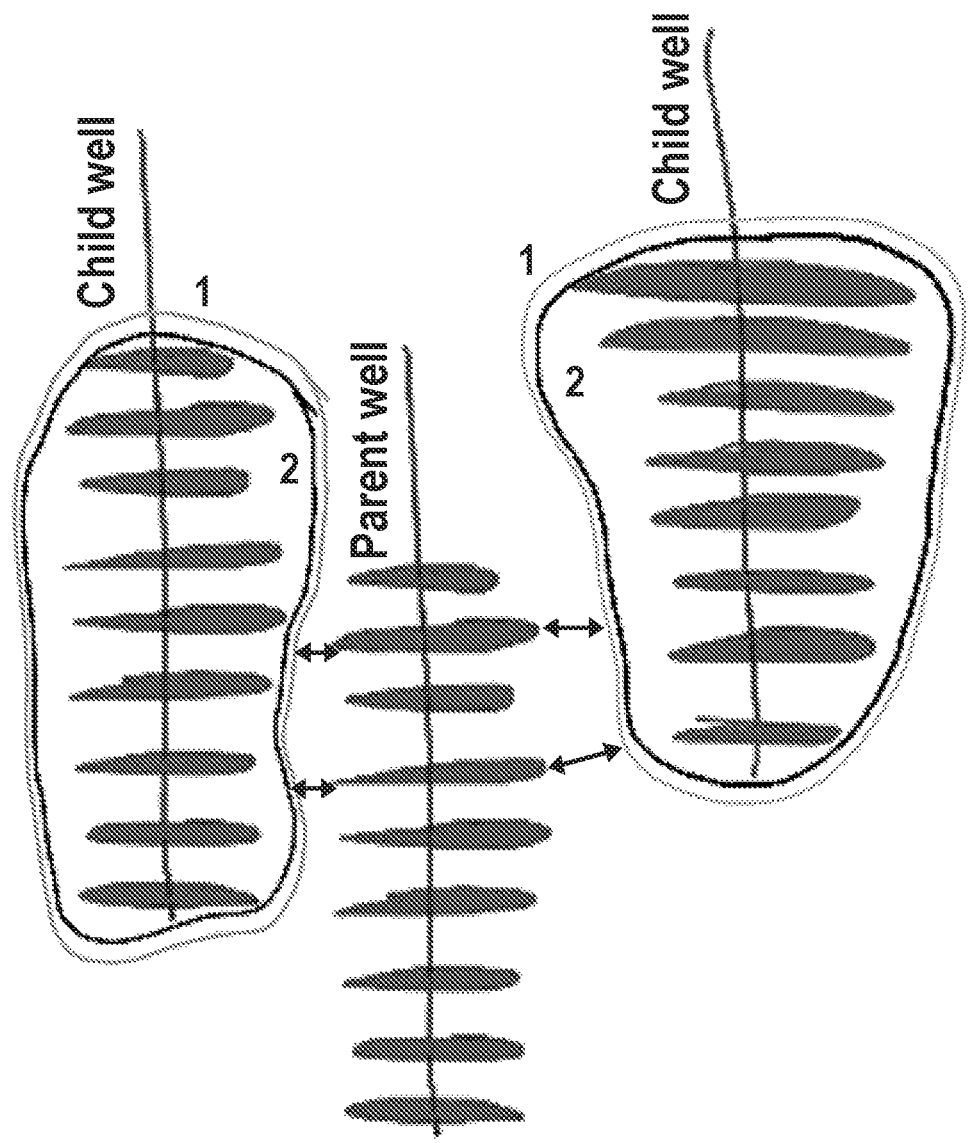
FIG. 10 illustrates critical (internal) and safe (external) surfaces for several wells. Distance between critical surface and parent well fractures.

For several treated and several child wells these surface can form closed loops. FIG. 10 shows safe and critical surface in case of two child wells. Distance between the critical surface and the parent well can be controlled and minimized for more effective area coverage with fractures.

What is claimed:

1. A method of predicting and preventing an event of fracture hit during stimulation treatment of a formation, the method comprising:
    a) providing a well production pad with a parent well with completed fractures and a child well with a growing fracture;
    b) providing formation data, parent well data, and a child well fracture job design for a child well fracture job, wherein the child well fracture job comprises a fracturing operation in the child well;
    c) generating a model that models a transfer of fluid, pressure, or both, between the parent well and the child well;
    d) simulating, via the model, a set of precalculated pressure scenarios for the child well fracture job design;
    e) identifying one or more fracture hit scenarios in the set of precalculated pressure scenarios from stage (d), wherein the one or more fracture hit scenarios are indicative of direct fluid communication between the parent well and the child well;
    f) performing, in the child well, the fracturing operation of the child well fracture job according to the child well fracture job design;
    g) monitoring pressure data in the parent well and the child well during the performance of the fracturing operation in the child well;
    h) matching the pressure data for the parent well and the child well with the one or more fracture hit scenarios from the stage (e);
    i) if matching of the one or more fracture hit scenarios with pressure data is positive, stopping the child well fracture job; and
    j) if matching of the one or more fracture hit scenarios with pressure data is negative, continuing the child well fracture job until the child well fracture job is finished according to the child well fracture job design.

2. The method of claim 1, wherein the model comprises a submodel for modeling a stress field emanating from the child well, a submodel for modeling direct fluid migration between the parent well and the child well, and a submodel for modeling pressure response in the parent well.

3. The method of claim 1, wherein simulating at stage (d) uses a proppant transport model.

4. The method of claim 1, wherein the set of precalculated pressure scenarios is dependent on a fluid distribution between fracturing clusters for the growing fracture in the child well and the completed fractures in the parent well.

5. The method of claim 1, wherein modeling the transfer of fluid, pressure, or both, between the parent well and the child well describes a stress shadow within the formation for the set of precalculated pressure scenarios.

6. The method of claim 1, wherein the set of precalculated pressure scenarios are stored in a pressure response database.

7. The method of claim 1, wherein the parent well and the child well are equipped with pressure sensors.

8. The method of claim 1, wherein matching the pressure data is performed using spectral density spectrograms.

* * * * *